US012783011B2

(12) United States Patent
Kang et al.

(10) Patent No.: US 12,783,011 B2
(45) Date of Patent: Nov. 3, 2026

(54) SUBSTRATE FOR DISPLAY

(71) Applicant: LG INNOTEK CO., LTD., Seoul (KR)

(72) Inventors: Sung Won Kang, Seoul (KR); Jae Seok Park, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 255 days.

(21) Appl. No.: 18/527,774

(22) Filed: Dec. 4, 2023

(65) Prior Publication Data

US 2024/0107795 A1 Mar. 28, 2024

Related U.S. Application Data

(63) Continuation of application No. 17/775,647, filed as application No. PCT/KR2020/015661 on Nov. 10, 2020, now Pat. No. 11,877,466.

(30) Foreign Application Priority Data

Nov. 20, 2019 (KR) ........................ 10-2019-0149356

(51) Int. Cl.
*B32B 3/26* (2006.01)
*B32B 3/30* (2006.01)
(Continued)

(52) U.S. Cl.
CPC ............ *G06F 1/1652* (2013.01); *B32B 3/266* (2013.01); *B32B 3/30* (2013.01); *B32B 15/043* (2013.01);
(Continued)

(58) Field of Classification Search
CPC ........ H10K 50/84; H10K 77/00; H10K 77/10; H10K 77/111; H10K 59/12;
(Continued)

(56) References Cited

U.S. PATENT DOCUMENTS 9,354,476 B2 5/2016 Han et al.
9,603,241 B2 3/2017 Myung et al.
(Continued)

FOREIGN PATENT DOCUMENTS

CN 205881905 1/2017
CN 107025851 8/2017
(Continued)

OTHER PUBLICATIONS

International Search Report dated Mar. 5, 2021 issued in Application No. PCT/KR2020/015661.
(Continued)

*Primary Examiner* — Megha M Gaitonde
(74) *Attorney, Agent, or Firm* — KED & ASSOCIATES

(57) ABSTRACT

A substrate for a display, according to one embodiment, comprises: one surface; another surface which is the reverse of the one surface; a first area; and second areas, wherein the one surface is folded so as to face itself, the first area is defined as a folding area, and the second areas are defined as unfolding areas. The substrate for a display comprises a first layer, and a second layer which is disposed on the first layer, wherein the first area of the first layer comprises a plurality of first holes or first grooves, the first layer is an etch layer, and the second layer is an etch stopper layer.

13 Claims, 9 Drawing Sheets

(51) Int. Cl.

| | |
|---|---|
| ***B32B 15/04*** | (2006.01) |
| ***B32B 15/18*** | (2006.01) |
| ***B32B 15/20*** | (2006.01) |
| ***G06F 1/16*** | (2006.01) |
| *H10K 102/00* | (2023.01) |

(52) U.S. Cl.
CPC .............. *B32B 15/18* (2013.01); *B32B 15/20* (2013.01); *B32B 2307/51* (2013.01); *B32B 2307/732* (2013.01); *B32B 2457/20* (2013.01); *H10K 2102/311* (2023.02)

(58) Field of Classification Search
CPC ..... H10K 2102/311; B32B 3/266; B32B 3/30; B32B 15/043; B32B 15/18; B32B 15/20; B32B 2307/51; B32B 2307/732; B32B 2457/20–208; G06F 1/1681; G06F 1/1652; G06F 2203/04102; G09F 9/301; H04M 1/0268; Y10T 428/2416; Y10T 428/24215; Y10T 428/24273; Y10T 428/24298–24347; Y10T 428/24479; Y10T 428/2457; Y10T 428/24562; Y10T 428/24612; Y10T 428/24942; Y10T 428/2495
USPC ....... 428/121, 124, 131, 134–140, 156, 166, 428/167, 172, 212, 213, 220
See application file for complete search history.

(56) References Cited

U.S. PATENT DOCUMENTS

| | | | | |
|---|---|---|---|---|
| 9,686,837 | B1 | 6/2017 | Yang et al. | |
| 9,983,424 | B2 | 5/2018 | Kim et al. | |
| 10,056,443 | B2 | 8/2018 | Shyu | |
| 10,074,824 | B2 | 9/2018 | Han et al. | |
| 10,164,208 | B2 | 12/2018 | Lee et al. | |
| 10,558,242 | B2 | 2/2020 | Kim et al. | |
| 2016/0357052 | A1 | 12/2016 | Kim et al. | |
| 2017/0171939 | A1 | 6/2017 | Yang et al. | |
| 2018/0097197 | A1 | 4/2018 | Han et al. | |
| 2018/0190936 | A1 | 7/2018 | Lee et al. | |
| 2019/0005857 | A1 | 1/2019 | Wakata | |
| 2019/0302850 | A1 | 10/2019 | Park et al. | |
| 2020/0389986 | A1 | 12/2020 | Tsuchihashi | |
| 2021/0217975 | A1 | 7/2021 | Gu et al. | |
| 2022/0399521 | A1 * | 12/2022 | Kang | G06F 1/1652 |

FOREIGN PATENT DOCUMENTS

| | | | |
|---|---|---|---|
| CN | 107886846 | 4/2018 | |
| CN | 108268170 | 7/2018 | |
| CN | 108807424 | 11/2018 | |
| CN | 109903679 | 6/2019 | |
| CN | 110047881 | 7/2019 | |
| EP | 0997937 | 5/2000 | |
| JP | 2019125624 | 7/2019 | |
| KR | 10-2015-0017819 | 2/2015 | |
| KR | 10-2016-0144912 | 12/2016 | |
| KR | 10-2017-0015599 | 2/2017 | |
| KR | 10-2018-0079091 | 7/2018 | |
| KR | 10-2019-0078994 | 7/2019 | |
| KR | 10-2019-0116592 | 10/2019 | |
| WO | WO-2021101149 A1 * | 5/2021 | B32B 15/18 |

OTHER PUBLICATIONS

U.S. Office Action dated May 11, 2023 issued in parent U.S. Appl. No. 17/775,647.

* cited by examiner

SUBSTRATE FOR DISPLAY

CROSS-REFERENCE TO RELATED APPLICATIONS

This application is a Continuation Application of U.S. patent application Ser. No. 17/775,647 filed May 10, 2022, which is a U.S. National Stage Application under 35 U.S.C. § 371 of PCT Application No. PCT/KR2020/015661, filed Nov. 10, 2020, which claims priority to Korean Patent Application No. 10-2019-0149356, filed Nov. 20, 2019, whose entire disclosures are hereby incorporated by reference.

BACKGROUND

1. Field

An embodiment relates to substrate for display.

2. Background

Recently, there is an increasing demand for a flexible or foldable display device capable of easily carrying various applications and displaying an image on a large screen when being carried.

Such a flexible or foldable display device is folded or partially bent when being carried or stored, and may be implemented with the display unfolded when displaying images. Accordingly, an image display area may be increased, and a user may easily carry the display.

After the flexible or foldable display device is folded or bent, a restoration process of unfolding the flexible display device again may be repeated.

That is, since the flexible or foldable display device repeats folding and unfolding operations, the substrate of the flexible display device is required to have a certain strength and elasticity, and cracks and deformations should not occur in the substrate during folding and restoring.

Meanwhile, the substrate for display constituting a flexible or foldable display device generally uses a metal substrate.

Accordingly, the substrate for display including the metal may be subjected to compressive and tensile stresses in the folding region as folding and unfolding are repeated, and thus, cracks may occur in the folding region, thereby reducing reliability.

Accordingly, it is possible to prevent such cracks by forming holes for dispersing stress in the substrate for display. However, when the substrate for display and a panel such as a display panel are adhered, a hole formed in the substrate for display may be transferred to the display panel and visually recognized. To prevent this, an additional layer may be disposed between the substrate for display and the display panel.

Accordingly, the thickness of the substrate for display may be increased by disposing the additional layer. Accordingly, the size of the radius of curvature (R) of the substrate for display may be reduced, and thus the folding size may be reduced.

Therefore, there is a need for the substrate for display having a new structure that can ensure the reliability of the substrate for display and can be implemented with a thin thickness to have a small radius of curvature for folding.

BRIEF DESCRIPTION OF THE DRAWINGS

The embodiments will be described in detail with reference to the following drawings in which like reference numerals refer to like elements wherein.

DETAILED DESCRIPTION

Hereinafter, embodiments of the present invention will be described in detail with reference to the accompanying drawings. However, the spirit and scope of the present invention is not limited to a part of the embodiments described, and may be implemented in various other forms, and within the spirit and scope of the present invention, one or more of the elements of the embodiments may be selectively combined and replaced.

In addition, unless expressly otherwise defined and described, the terms used in the embodiments of the present invention (including technical and scientific terms) may be construed the same meaning as commonly understood by one of ordinary skill in the art to which this invention belongs, and the terms such as those defined in commonly used dictionaries may be interpreted as having a meaning that is consistent with their meaning in the context of the relevant art.

In addition, the terms used in the embodiments of the present invention are for describing the embodiments and are not intended to limit the present invention. In this specification, the singular forms may also include the plural forms unless specifically stated in the phrase, and may include at least one of all combinations that may be combined in A, B, and C when described in "at least one (or more) of A (and), B, and C".

Further, in describing the elements of the embodiments of the present invention, the terms such as first, second, A, B, (a), and (b) may be used. These terms are only used to distinguish the elements from other elements, and the terms are not limited to the essence, order, or order of the elements.

In addition, when an element is described as being "connected", "coupled", or "connected" to another element, it may include not only when the element is directly "connected" to, "coupled" to, or "connected" to other elements, but also when the element is "connected", "coupled", or "connected" by another element between the element and other elements.

Further, when described as being formed or disposed "on (over)" or "under (below)" of each element, the "on (over)" or "under (below)" may include not only when two elements are directly connected to each other, but also when one or more other elements are formed or disposed between two elements.

Furthermore, when expressed as "on (over)" or "under (below)", it may include not only the upper direction but also the lower direction based on one element.

Hereinafter, a substrate for display according to an embodiment will be described with reference to drawings.

Figure 1:
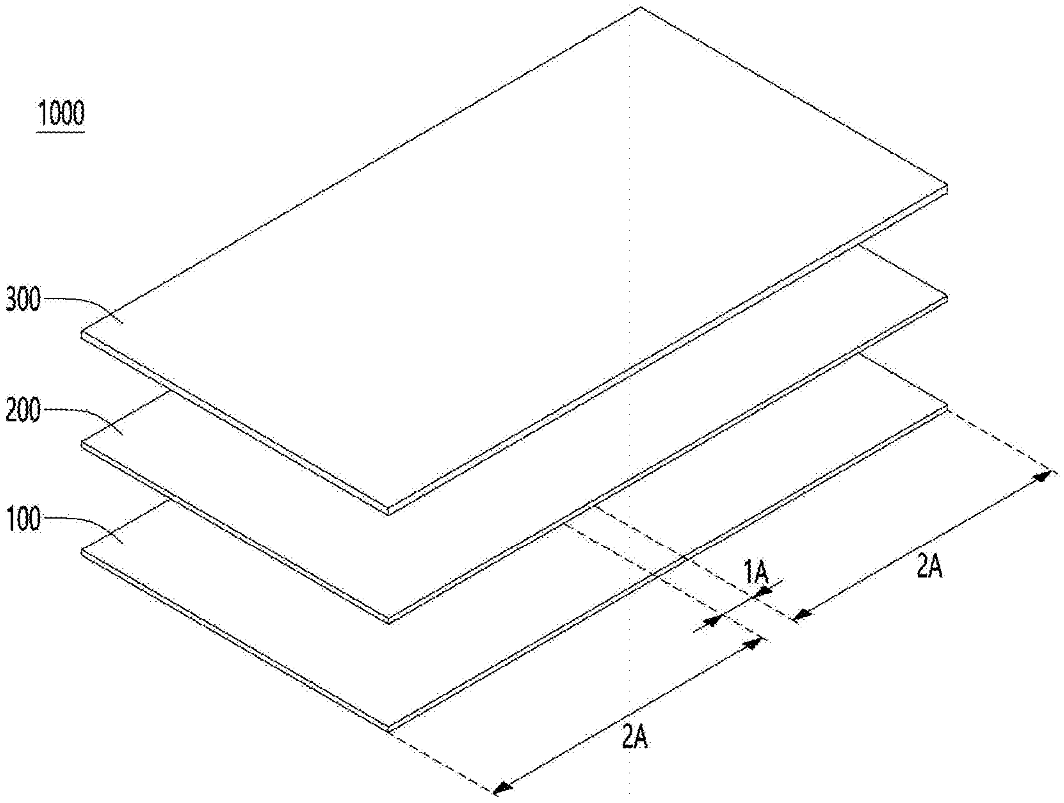
FIG. 1 is a perspective view of a flexible display device according to an embodiment.

FIG. 1 is perspective views of a flexible or foldable display device according to an embodiment.

Referring to FIG. 1, a flexible or foldable display device 1000 according to an embodiment may include a substrate 100, a display panel 200 disposed on the substrate 100, and a touch panel 300 disposed on the display panel 200.

The substrate 100 may support the display panel 200 and the touch panel 300. That is, the substrate 100 may be a support substrate supporting the display panel 200 and the touch panel 300.

The substrate 100 may include a material such as metal. For example, the substrate 100 may include metal, metal alloy, plastic, a composite material (e.g., carbon fiber reinforced plastic, a magnetic or conductive material, a glass fiber reinforced material, etc.), ceramic, sapphire, glass, and the like.

The substrate 100 may be flexible or foldable. That is, the substrate 100 may be folded or bent in one direction. That is, the substrate 100 may be a substrate for display applied to a flexible display device or a foldable display device.

The substrate 100 may include at least two areas. In detail, the substrate 100 may include a first area 1A and a second area 2A.

The first area 1A may be defined as an area where the substrate 100 is folded. That is, the first area 1A may be a folding area.

In addition, the second area 2A may be defined as an area where the substrate 100 is not folded. That is, the second area 2A may be an unfolding area.

The first area 1A and the second area 2A will be described in detail below.

The display panel 200 may be disposed above the substrate 100.

The display panel 200 may include a plurality of pixels including a switching thin film transistor, a driving thin film transistor, a power storage device, and an organic light-emitting diode (OLED). In case of the OLED, deposition may be performed at a relatively low temperature, and the OLED may be mainly applied to a flexible display device for reasons such as low power and high luminance. Here, a pixel refers to a minimum unit for displaying an image, and the display panel displays an image through a plurality of pixels.

The display panel may include a substrate, a gate line disposed on the substrate, a data line crossing with the gate line in isolation, and a common power line. In general, one pixel may be defined by the gate line, the data line, and the common power line as a boundary.

The substrate may include a material having flexible properties such as a plastic film, and the display panel 200 may be implemented by disposing an organic light-emitting diode and a pixel circuit on a flexible film.

The touch panel 300 may be disposed above the display panel 200. The touch panel 300 may implement a touch function in the flexible display device, and the touch panel may be omitted in the foldable display device that simply displays an image without the touch function.

The touch panel 300 may include a substrate and a touch electrode disposed on the substrate. The touch electrode may sense a position of an input device that is touched on the flexible display device using a capacitance type or a resistive film type.

The substrate of the touch panel 300 may include a material having flexible properties such as a plastic film, and the touch panel 300 may be implemented by disposing the touch electrode on the flexible film.

Meanwhile, although not shown in the drawing, a cover window protecting the foldable display device may be additionally disposed above the touch panel 300 or above the display panel 200 (when the touch panel is omitted).

Meanwhile, the substrate 100, the display panel 200, and the touch panel 300 may be adhered to each other through an adhesive layer or the like.

The substrate 100 of the flexible display device to be described below has a structure capable of improving the folding reliability of the substrate.

As described above, the flexible display device includes the substrate 100

Figure 2:
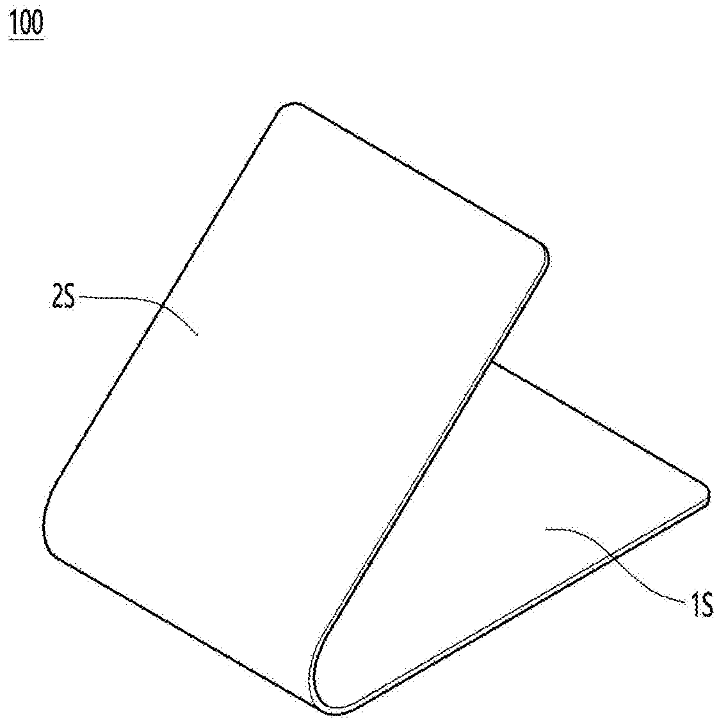
FIG. 2 is a perspective view of a substrate for display according to an embodiment.

Referring to FIG. 2, the substrate 100 may be bent in one direction.

In detail, the substrate 100 may include one surface 1S and the other surface 2S opposite to the one surface 1S. In the substrate 100, the one surface 1S or the other surface 2S may be bent to face each other.

In the following description, as shown in FIG. 2, it will be mainly described that the one surfaces 1S are bent in a direction facing each other in the substrate 100.

As described above, the first area 1A and the second area 2A may be defined in the substrate 100. The first area 1A and the second area 2A may be areas defined when the one surfaces 1S are bent in the direction facing each other in the substrate 100.

In detail, the substrate 100 is bent in one direction, and the substrate 100 may be divided into the first area 1A which is a folded area (folding area) and the second area 2A which is an unfolded area (unfolding area).

Figure 3:
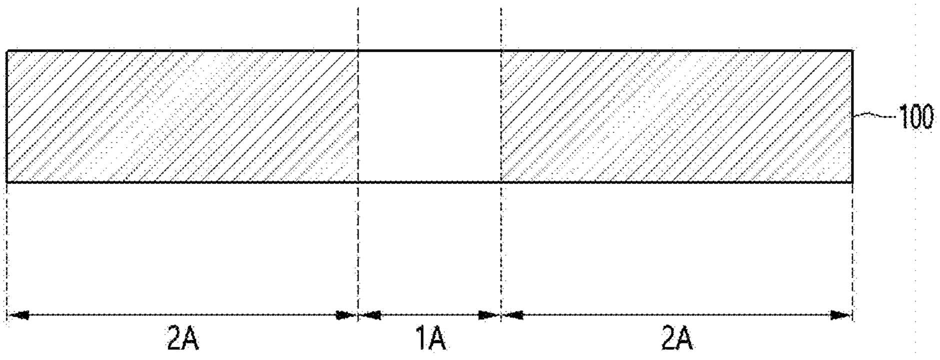
FIG. 3 is a side view of the substrate for display before folding according to an embodiment.
Figure 4:
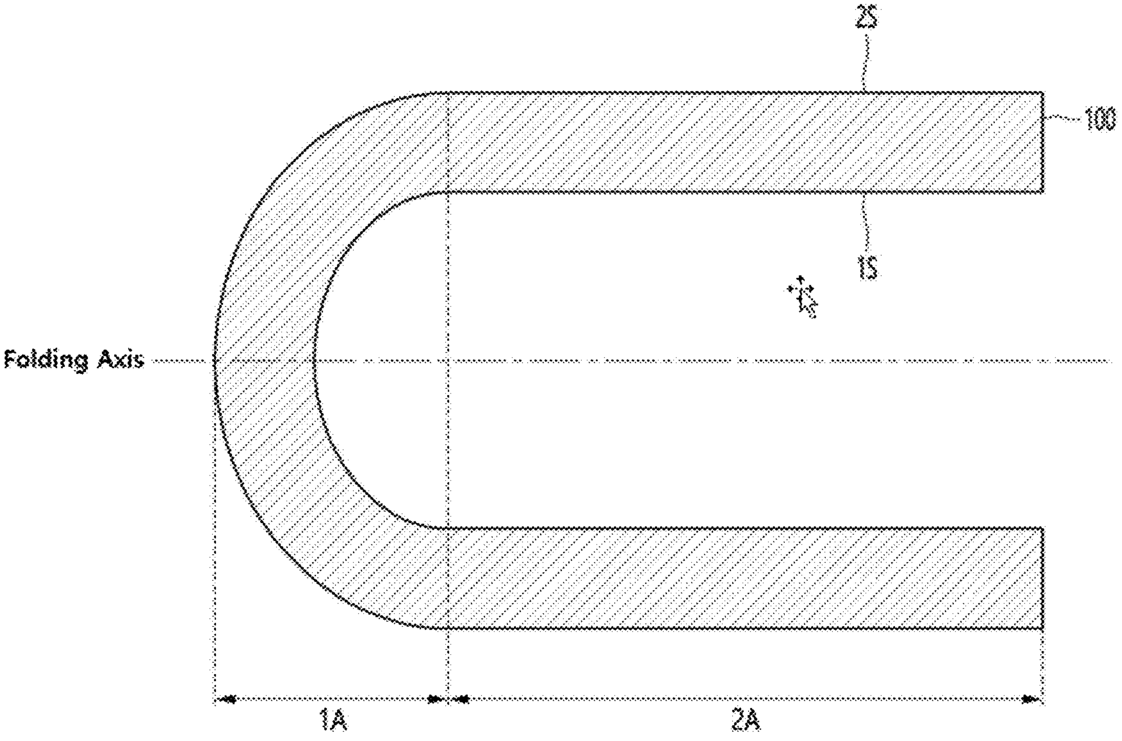
FIG. 4 is a side view of the substrate for display after folding according to an embodiment.

Referring to FIG. 3 and FIG. 4, the substrate 100 may include the first area 1A that is an area where the substrate 100 is bent. The substrate 100 may include the second area 2A that is not bent and is disposed adjacent to the first area 1A.

For example, the second area 2A may be formed on the left side and the right side of the first area 1A based on the direction in which the substrate 100 is bent. That is, the second area 2A may be disposed at both ends of the first area 1A. That is, the first area 1A may be disposed between the second areas 2A.

The first area 1A and the second area 2A may be formed on the same substrate 100. That is, the first area 1A and the second area 2A may be formed integrally with each other without being separated on the same substrate 100.

Sizes of the first area 1A and the second area 2A may be different from each other. In detail, the size of the second area 2A may be larger than the size of the first area 1A.

In the drawings, it is illustrated that the first area 1A is positioned in a central portion of the substrate 100, but the embodiment is not limited thereto. That is, the first area 1A may be positioned in one end and an end area of the substrate 100. That is, the first area 1A may be positioned at one end and the end area of the substrate 100 such that the size of the second area 2A is asymmetric.

FIG. 4 is a side view of the substrate for display after the substrate is folded.

Referring to FIG. 4, the substrate 100 may be folded in one direction around a folding axis. In detail, the one surface 1S may be folded in a direction facing each other along the folding axis.

As the substrate 100 is folded in one direction, the first area 1A and the second area 2A may be formed on the substrate 100. That is, the folding area formed by folding the substrate 100 in one direction and the unfolding area positioned at both ends of the folding area may be formed in the substrate 100.

The folding area may be defined as an area where a curvature R is formed, and the unfolded area may be defined as an area where the curvature R is not formed or the curvature is close to zero.

Referring to FIGS. 3 and 4, the substrate 100 may be folded in one direction to be formed in an order of the unfolding area, the folding area, and the unfolding area.

A plurality of hole or groove-shaped pattern portion may be formed in at least one of the first area 1A and the second area 2A to control and disperse stress generated when the substrate 100 is folded.

FIGS. 5 to 8 are views for explaining a substrate for display according to the first embodiment.

Figure 5:
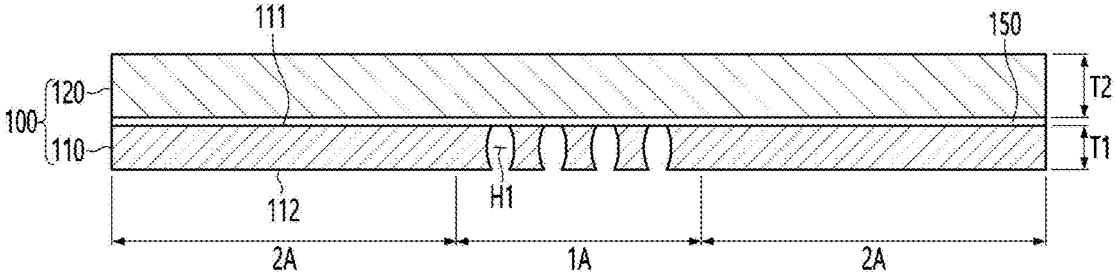
FIG. 5 is a cross-sectional view of the substrate for display according to the first embodiment.
Figure 6:
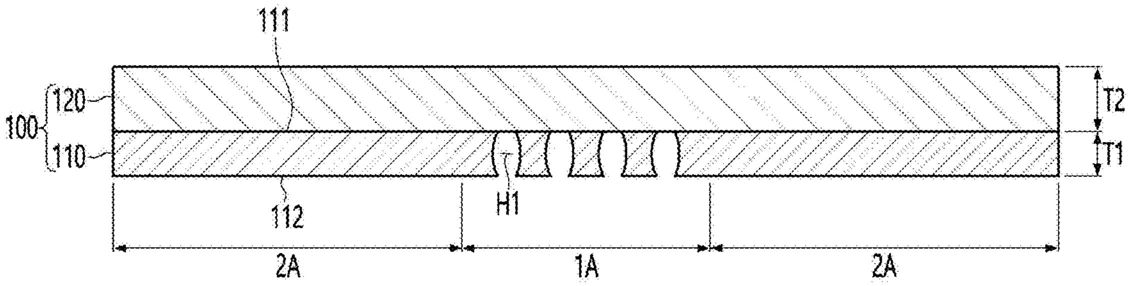
FIG. 6 is another cross-sectional view of the substrate for display according to the first embodiment.

FIGS. 5 and 6 are views a cross-sectional view of the substrate for display according to the first embodiment. Referring to FIGS. 5 and 6, the substrate 100 may include a plurality of layers. That is, the substrate 100 may be formed in a multi-layer structure.

In detail, the substrate 100 may include a first layer 110 and a second layer 120 on the first layer 110. In addition, the substrate 100 may further include an intermediate layer 150 disposed between the first layer 110 and the second layer 120.

The first layer 110 may support the second layer 120. Also, the second layer 120 may support a display panel or a touch panel disposed on the substrate for display.

The first layer 110 and the second layer 120 may be adhered to each other. For example, the first layer 110 and the second layer 120 may be adhered to each other by a thermocompression process or the like.

The intermediate layer 150 may be an interface layer between the first layer 110 and the second layer 120. In detail, the intermediate layer 150 may be defined as an interface layer formed during an adhesion process between the first layer 110 and the second layer 120.

A pattern may be formed on any one of the first layer 110 and the second layer 120. In detail, a hole-shaped pattern may be formed in any one of the first layer 110 and the second layer 120.

For example, referring to FIGS. 5 and 6, a plurality of first holes H1 penetrating through the first surface 111 of the first layer 110 and a second surface 112 opposite to the first surface 111 may be formed in the first layer 110.

In detail, the first layer 110 includes the first surface 111 facing the second layer 120 and the second surface 112 opposite to the first surface 111, and the first layer 110 may have a hole or groove-shaped pattern formed from the second surface in the direction of the first surface.

In detail, the first layer 110 may include a hole pattern formed to completely penetrate the first layer 110. Alternatively, the first layer 110 may include a groove pattern formed to partially penetrate the first layer 110.

Hereinafter, for convenience of explanation, the hole pattern formed in the first layer 110 will be mainly described, and the description of the hole pattern described below may be equally applied to the groove pattern.

That is, a hole pattern formed through the first layer 110 in a direction from the second surface to the first surface may be formed. That is, the first hole H1 may pass through the first layer 110 and may not be formed in the second layer 120.

Accordingly, a groove-shaped pattern may be formed on the entire substrate for display according to the first embodiment by the first hole H1 formed in the first layer.

The first hole H1 formed in the first layer 110 may distribute stress caused by folding when the substrate for display is folded or restored. Accordingly, it is possible to prevent deformation of the display substrate due to the stress generated when the display substrate is folded or restored.

Meanwhile, holes or groove patterns may not be formed in the second layer 120 and the intermediate layer 150. The second layer 120 may be disposed on the first layer 110 to prevent bending of the substrate for display.

In detail, the first hole H1 formed in the first layer 110 may disperse the stress generated during the folding or restoration process of the substrate for display. However, depending on the position or distribution of the hole pattern, the first layer 110 may be bent due to a stress imbalance in the first layer 110, and thus overall warpage may occur in the substrate for display.

At this time, the second layer 120 disposed on the first layer 110 controls the warpage that may occur in the first layer 110. It is possible to prevent the substrate for display from being bent by the second layer 120

The first layer 110 and the second layer 120 may include different materials. In detail, the first layer 110 and the second layer 120 may include materials having different etching characteristics.

For example, when the substrate 100 is etched using a first etchant, the first layer 110 is etched by reacting with the first etchant, and the second layer 120 may not be etched because it does not react with the first etchant.

Alternatively, when the substrate 100 is etched using a second etchant, the second layer 120 is etched by reacting with the second etchant, and the first layer 110 may not be etched because it does not react with the second etchant.

That is, the first layer 110 or the second layer 120 may be an etching stopper layer.

For example, the first layer 110 and the second layer 120 may include different metal materials. In detail, the first layer 110 and the second layer 120 may include any one of Stainless Steel (SUS), copper, titanium, aluminum, and alloys thereof, and in this case, the first layer 110 and the second layer 120 may include different metal materials.

For example, the first layer 110 may include copper (Cu) and the second layer 120 may include Stainless Steel (SUS) but the embodiment is not limited thereto.

The intermediate layer 150 may be an adhesive layer. For example, the intermediate layer 150 may include a pressure sensitive adhesive (PSA). In addition, metal particles may be dispersed in the intermediate layer 150. Accordingly, the thermal conductivity of the intermediate layer 150 may be increased by the metal particles, thereby improving the heat dissipation characteristics of the substrate for display.

In addition, the intermediate layer 150 may include the same material as at least one of the first layer 110 and the second layer 120. For example, the intermediate layer 150 may include an alloy material of a metal material included in the first layer 110 and a metal material included in the second layer 120.

Since the first layer 110 and the second layer 120 have different etching properties, only one of the first layer 110 and the second layer 120 may be etched in a specific etching solution.

That is, the first layer 110 and the second layer 120 may be etched by different etching solutions. In addition, the first layer 110, the second layer 120, and the intermediate layer 150 may be etched by different etching solutions.

In the first embodiment, a first hole H1 may be formed by etching the first layer 110. At this time, when the first hole H1 is formed in the first layer 110, the second layer 120 may serve as an etching stopper, Accordingly, only the first layer 110 may be etched to form a first hole H1.

In this case, since the second layer 120 serves as an etching stopper, a hole may not be formed in the second layer 120. Also, holes may not be formed in the intermediate layer 150. In addition, as the second layer 120 includes a metal, elasticity and heat dissipation characteristics may be improved.

Accordingly, when the first hole H1 is formed in the first layer 110, the depth of the hole can be easily controlled. In other words, it is possible to easily control the depth of the first hole H1 of the substrate for display by the first hole H1 formed in the first layer 110.

That is, since the depth of the first hole H1 formed in the substrate for display is equal to the depth of the first hole H1 formed in the first layer, that is, the thickness of the first layer. Accordingly, by controlling the thickness of the first layer according to the desired depth of the first hole H1, it is possible to easily control the depth of the groove of the substrate for display as a whole.

In general, a depth of a hole in a metal substrate formed by an etching process may be proportional to a diameter of the hole. That is, the depth of the hole formed in the metal substrate may increase as the size of the diameter of the hole increases.

Accordingly, there is a problem in that it is difficult to control the depth of the hole and the diameter of the hole, respectively. However, in the substrate for display according to the embodiment, since the first layer and the second layer have different etching characteristics, regardless of the size of the diameter of the hole, a hole of a desired depth can be formed. Accordingly, the diameter and depth of the pattern formed on the substrate for display can be easily controlled.

In addition, since the first layer and the second layer both contain a metal, the first layer and the second layer can be in close contact with each other with a strong adhesive force by an intermediate layer formed of an alloy, and have improved heat dissipation properties.

In the preceding description, it has been described that both the first layer 110 and the second layer 120 include a metal as an example, but any one of the first layer 110 and the second layer 120 may include a non-metal can do.

For example, when the first layer 110 becomes a layer to be etched and the second layer 120 becomes a layer to perform an etching stopper, the first layer 110 may include a metal, the second layer 120 may include a non-metal.

In detail, the first layer 110 may include any one of Stainless Steel (SUS), copper, titanium, aluminum, and an alloy thereof, and the second layer 120 may include a polymer.

For example, the second layer 120 may include any one of polyethylene terephthalate (PET), polycarbonate (PC), acrylonitrile-butadiene-styrene resin (ABS), poly methyl methacrylate (PMMA), polyethylene naphthalate (PEN), polyether sulfone (PES), cyclic olefin copolymer (COC), triacetylcellulose film (TAC), polyvinyl alcohol (PVA) film, a polyimide (PI) film, and a polystyrene (PS) film. Also, the second layer 120 may include at least one of a rubber-based polymer material, silicon, and ceramic.

An intermediate layer 150 may be disposed between the first layer 110 and the second layer 120 or the intermediate layer 150 may be omitted.

In detail, when the first layer 110 and the second layer 120 are adhered using a separate adhesive material as shown in FIG. 5, the substrate 100 may include an intermediate layer 150 defined as an adhesive layer between the first layer 110 and the second layer 120.

Alternatively, as shown in FIG. 6, when the first layer 110 and the second layer 120 are bonded by thermocompression without a separate adhesive material, the substrate 100 may omit an adhesive layer, that is, an intermediate layer.

That is, the first layer 110 and the second layer 120 are in direct contact, and a diffusion portion in which the elements of the two layers are diffused may be formed on the interface between the first layer 110 and the second layer 120.

In this case, an inorganic filler or the like may be added to the second layer 120 to improve heat dissipation characteristics.

As the second layer 120 includes the non-metal material as described above, it is possible to maintain the bending characteristics of the substrate for display even after the cold rolling process of the substrate for display, thereby improving the bending characteristics of the foldable substrate for display.

The total thickness of the substrate 100 including the first layer 110 and the second layer 120 may be about 1 mm. In detail, the thickness of the substrate 100 may be 0.5 mm to 1.5 mm. When the thickness of the substrate 100 is less than 0.5 mm, the strength of the substrate 100 may be reduced, and when the thickness of the substrate 100 exceeds 1.5 mm, the folding characteristic of the substrate 100 may be reduced.

The first layer 110 and the second layer 120 may be formed to have the same or different thicknesses.

For example, the thickness T1 of the first layer 110 in which the hole is formed may be greater than the thickness T2 of the second layer 120. In detail, in order to decrease the radius of curvature of the substrate for display, the depth of the first hole H1 should be increased. Accordingly, by forming the thickness of the first layer 110 to be greater than the thickness of the second layer 120, the depth of the first hole H1 may be increased.

Alternatively, the thickness T2 of the second layer 120 may be greater than the thickness T1 of the first layer 110. In detail, when the first hole H1 is formed in only one region of the first layer 110, in order to prevent warping of the substrate for display that may occur due to a stress difference with other regions, the thickness of the second layer 120 may be greater than a thickness of the first layer 110.

Accordingly, when the substrate for display is about to be bent due to different stress levels for each region in the first layer 110, the second layer 120 on the first layer 110 can hold it, so that it is possible to prevent the substrate for display from being warped.

Alternatively, the thickness of the first layer 110 and the second layer 120 may be formed to be the same in order to prevent the curvature radius and warpage of the substrate for display to be implemented.

In addition, the first layer 110 and the second layer 120 may have the same and similar elastic strength. For example, the first layer 110 and the second layer 120 may have an elastic strength of about 300 Pa to 2.5 GPa.

The first layer 110 and the second layer 120 may have the same or different elastic strengths depending on the use of the substrate for display.

That is, as described above, when the thickness of the first layer 110 is increased in order to deepen the depth of the first hole formed in the first layer 110, the elastic strength of the first layer 110 may be greater than that of the second layer 120. Accordingly, it is possible to offset a decrease in the folding characteristic due to the increased thickness of the first layer 110.

Alternatively, when the thickness of the second layer 120 is increased in order to control the warpage of the substrate for display, the elastic strength of the second layer 120 may be greater than that of the first layer 110. Accordingly, it is possible to offset a decrease in the folding characteristic due to the increased thickness of the second layer 120.

Hereinafter, the substrate for display according to a first embodiment will be described in detail with reference to FIGS. 7 to 10.

Figure 7:
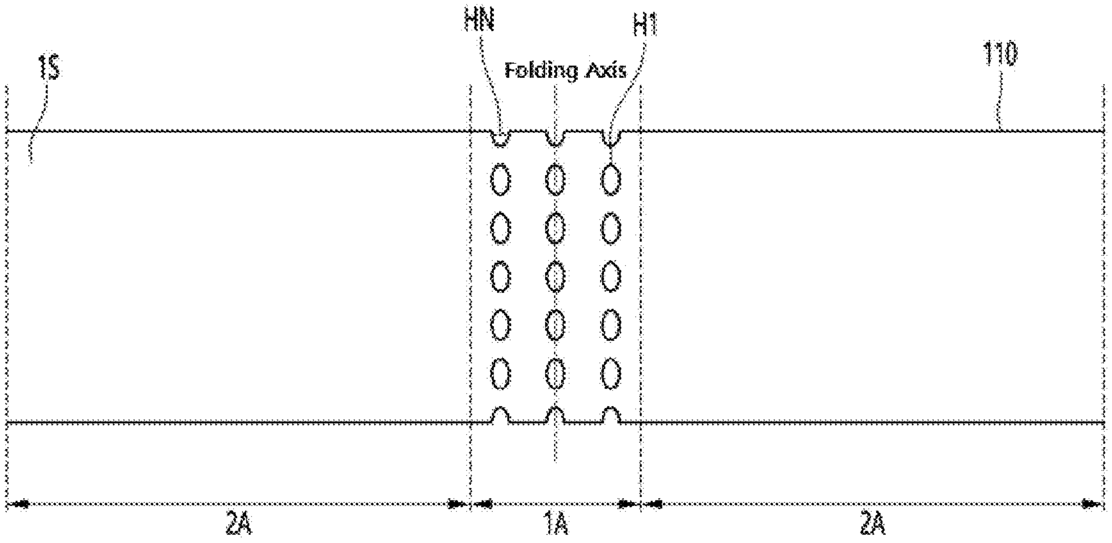
FIG. 7 is a top view of one surface of the substrate for display according to the first embodiment.
Figure 8:
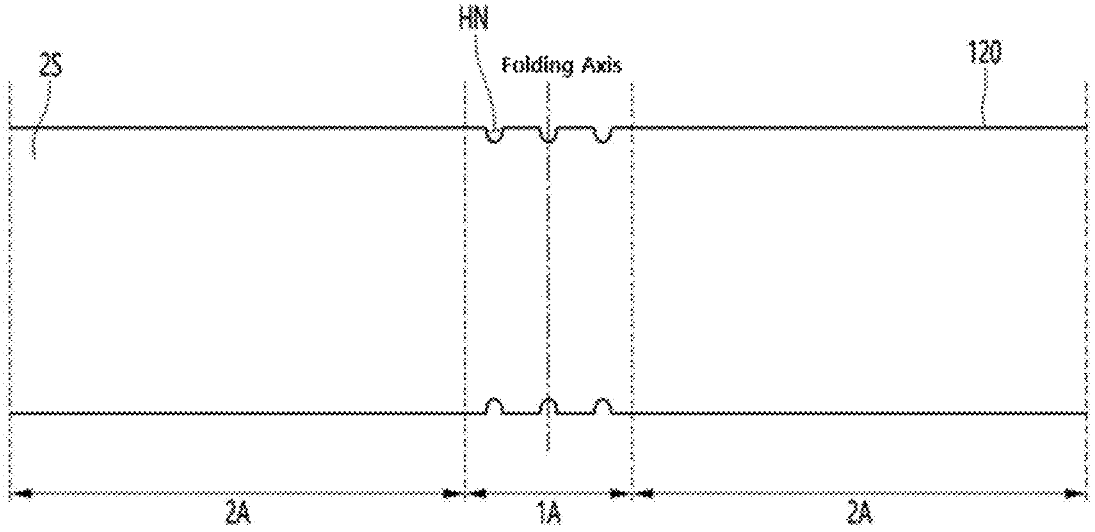
FIG. 8 is a top view of the other surface of the substrate for display according to the first embodiment.

FIGS. 7 and 8 a top view of one surface of the substrate for display according to the first embodiment.

That is, FIG. 7 is a top view of one surface 1S of the substrate, which is an inner surface of the substrate when the substrate 100 is folded, FIG. 8 is a top view of other surface 2S of the substrate, which is an outer surface of the substrate when the substrate 100 is folded.

In detail, FIG. 7 is a top view of the first layer 110, which is an inner surface of the substrate when the substrate 100 is folded, FIG. 8 is a top view of the second layer 120, which is an outer surface of the substrate when the substrate 100 is folded.

Referring to FIG. 7, a plurality of grooves formed by partially etching the substrate 100 may be formed in the substrate for display. In detail, a first hole H1 formed through the first layer 110 is formed in the first layer 110 of the substrate 100. Accordingly, the substrate for display may include a plurality of grooves as a whole.

In detail, a first hole H1 may be formed in the first region 1A of the first layer 110. In detail, a plurality of first holes H1 spaced apart from each other may be formed in the first region 1A of the first layer 110. In FIG. 7, only three first holes H1 formed in the first area 1A are illustrated, but this is for convenience of description, four or more first holes H1 may be formed in the first region 1A.

In the substrate for display, one surface of the second layer 120 may be exposed through the first hole H1 formed in the first layer 110.

The plurality of first holes H1 formed in the first region 1A serves to distribute stress generated when the first region is folded. In detail, due to the compressive stress generated when the substrate 100 is folded, in the first region 1A of the substrate, deformation or damage due to stress may occur.

Accordingly, by forming the first hole H1 in the first region 1A, it is possible to prevent stress from being concentrated in a specific region of the first region 1A. Accordingly, damage to the substrate may be prevented by compressive stress generated when the substrate 100 is folded.

The first hole H1 may be formed in various widths and depths according to the desired radius of curvature and reliability. In detail, the first hole H1 may be formed to have a width of 10 μm to 500 μm and a depth of 100 μm to 10000 μm, depending on the desired folding characteristic, that is, the size of the radius of curvature and reliability.

The first hole H1 may be formed in a regular pattern in the first region 1A, or the first hole H1 may be formed in an irregular pattern in the first region 1A.

The first hole H1 may be formed to have a curved surface. In detail, the first hole H1 may be formed in a shape having a curved surface, such as an elliptical shape, a hemispherical shape, or a circular shape.

However, the embodiment is not limited thereto, and the first hole H1 may be formed in a polygonal shape such as a triangle or a square.

Meanwhile, the first hole H1 may be filled with a resin material. In detail, a resin material such as silicone may be filled in the first hole H1 formed in the first layer 110. Thereby, it is possible to prevent foreign substances from entering the pattern formed on the substrate for display, and it is possible to smooth the surface of the substrate for display on which the pattern is formed.

Referring to FIG. 8, a separate hole or groove pattern may not be formed in the second layer 120 of the substrate 100. In detail, one surface of the second layer 120 may be formed to be flat.

That is, the second layer 120 may be disposed while covering both the region in which the first hole H1 is formed and the region in which the first hole H1 is not formed in the first layer 110.

In this case, the thickness of the second layer 120 may be formed to be greater than the thickness of the first layer 110. That is, in the first layer 110, since the first hole H1 is formed only in the first region that is the folding region, a stress difference may occur between the first region and the second region that is the unfolding region.

Due to this stress difference, warpage may occur in the first layer 110, and as a whole, warpage may occur in the substrate for display.

Accordingly, by forming the thickness of the second layer 120 to be greater than the thickness of the first layer 110, it is possible to prevent bending due to a difference in stress in the first layer 110. That is, bending of the display substrate by the first layer 110 and second layer 120 can be controlled.

Meanwhile, the first region 1A and the second region 2A may be divided according to whether or not a hinge part is formed. That is, the folding area and the unfolding area may be divided according to whether or not the hinge part is formed.

In detail, a plurality of hinge parts may be formed in the first region 1A, and no hinge parts may be formed in the second region 2A.

That is, the folding region may be defined as a region in which the hinge part HN is formed.

The hinge part HN may be defined as a point at which folding starts in the substrate 100. That is, the substrate may start folding from the hinge parts at both ends of the plurality of hinge parts.

The hinge part HN may include a plurality of hinge parts according to the folding shape of the substrate 100. The hinge part HN may be formed at both ends of the substrate 100 overlapping the column direction in which the first through-holes H1 are formed based on the short direction length of the substrate 100 in the width direction.

Accordingly, when the substrate for display 100 is folded by the hinge part HN. the folding area can be easily folded.

The hinge part HN may be formed through one surface and the other surface of the short direction area among the end areas of the substrate 100. That is, the hinge part HN may be defined as a hole in which both end areas in the short direction among the end areas of the substrate 100 are penetrated.

The shape of the hinge part HN may be the same as or different from the shape and size of the first hole. For example, the hinge part may be formed while having a curved surface. In detail, the hinge part may be formed in a shape having a curved surface, such as an elliptical shape, a hemispherical shape, or a circular shape.

However, the embodiment is not limited thereto, and the hinge portion may be formed in a polygonal shape such as a triangle or a quadrangle or an oval shape.

Figure 9:
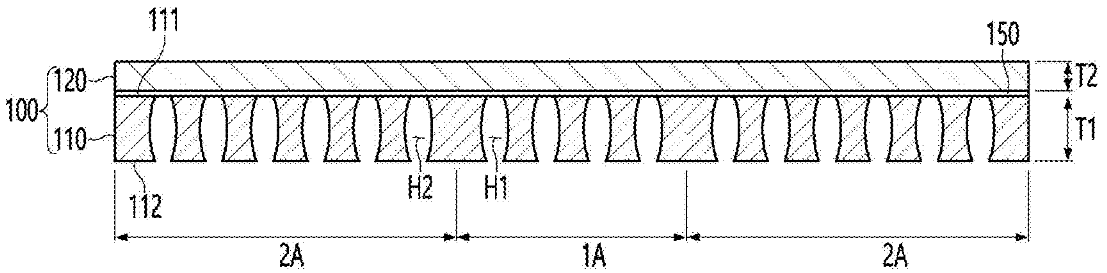
FIG. 9 is another cross-sectional view of the substrate for display according to the first embodiment.
Figure 10:
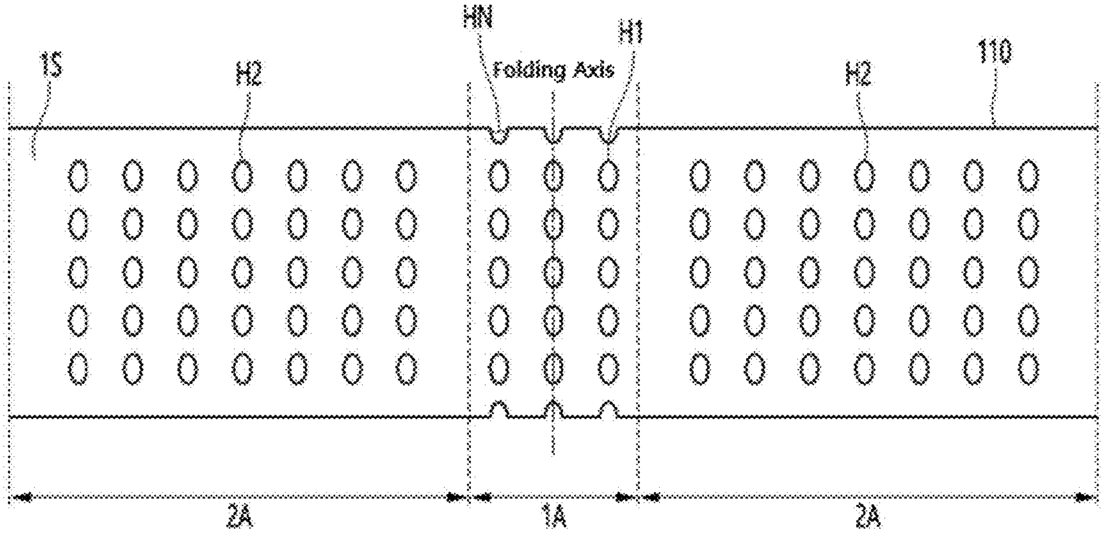
FIG. 10 is another top view of one surface of the substrate for display according to the first embodiment.

Meanwhile, referring to FIGS. 9 and 10, holes may be formed in the entire area of the substrate for display.

FIG. 9 is another cross-sectional view of the substrate for display according to the first embodiment. And FIG. 10 is another top view of one surface of the substrate for display according to the first embodiment. That is, FIG. 10 is a top view of the first layer 110 that is an inner surface of the substrate 100 when the substrate 100 is folded.

Referring to FIGS. 9 and 10, holes may be formed in both the first region 1A and the second region 2A in the first layer 110. In detail, a second hole H2 may also be formed in the second area 2A defined as an unfolding area. That is, holes may be formed in the entire area of the substrate for display.

A plurality of second holes H2 spaced apart from each other may be formed in the second region 2A. The second hole H2 may be formed through the first layer 110. In detail, the second hole H2 may be formed through the first surface 111 and the second surface 112 of the first layer 110.

Due to the second hole H2 formed in the second region 2A, a difference in deformation between the first region 1A and the second region 2A according to heat may be reduced.

In detail, by forming holes in both the first region 1A and the second region 2A, the difference between the deformation due to heat in the first region 1A and the deformation due to heat in the second region 2A may be reduced. Accordingly, it is possible to prevent the substrate for display from being bent or distorted.

In this case, the thickness of the first layer 110 may be greater than the thickness of the second layer 120.

Accordingly, the thickness of the first layer 110 may be formed to be greater than the thickness of the second layer 120. That is, since holes are formed in the entire region of the first layer 110, the thickness of the second layer 120 to prevent warping of the first layer may be reduced, and the depth of the hole formed in the first layer may be increased.

Accordingly, by reducing the radius of curvature of the substrate for display, it is possible to improve the folding characteristics of the substrate for display.

The second hole H2 may be formed in various widths and depths according to the desired radius of curvature and reliability. In detail, the second hole H2 may be formed to have a width of 10 μm to 500 μm and a depth of 100 μm to 10000 μm, depending on the desired folding characteristic, that is, the size of the radius of curvature and reliability.

The second holes H2 formed in the second region 2A may be formed in a regular pattern in the second region 2A, or the second holes H2 formed in the second region 2A H2 may be formed in an irregular pattern in the second region 2A.

The second hole H2 formed in the second region 2A may have a curved surface. In detail, the second hole H2 formed in the second region 2A may be formed in a shape having a curved surface, such as an elliptical shape, a hemispherical shape, or a circular shape.

However, the embodiment is not limited thereto, and the second hole H2 formed in the second region 2A may be formed in a polygonal shape such as a triangle or a square.

Hereinafter, a substrate for display according to a second embodiment will be described with reference to FIGS. 11 to 16. In the description of the substrate for display according to the second embodiment, descriptions of the same and similar descriptions as those of the substrate for display according to the first embodiment described above will be omitted, and the same reference numerals will be given to the same components.

Referring to FIGS. 11 to 14, the substrate for display according to the second embodiment may further include a third layer 130.

In detail, the substrate 100 may include a first layer 110, a second layer 120 on the first layer 110, and a third layer 130 on the second layer 120. That is, the second layer 120 may be disposed between the first layer 110 and the third layer 130.

In addition, the substrate 100 is formed between a first intermediate layer 151 disposed between the first layer 110 and the second layer 120 and a second intermediate layer 152 disposed between the second layer 120 and the third layer 130.

The first layer 110 and the second layer 120 may be adhered to each other. Also, the second layer 120 and the third layer 130 may be adhered to each other. For example, the first layer 110 and the second layer 120, the second layer 120 and the third layer 130 may be adhered to each other by a thermocompression process or the like.

The first intermediate layer 151 may be an interfacial layer between the first layer 110 and the second layer 120, and the second intermediate layer 152 may be an interfacial layer between the second layer 120 and the third layer 130. In detail, the first intermediate layer 151 and the second intermediate layer 152 may be defined interface layers formed during the bonding process of the first layer 110, the second layer 120, and the third layer 130.

The first layer 110, the second layer 120, and the third layer 130 may all include a metal. For example, the first layer 110, the second layer 120, and the third layer 130 may include any one of Stainless Steel (SUS), copper, titanium, aluminum, and an alloy thereof.

In addition, the first intermediate layer 151 and the second intermediate layer 152 may include the same material as at least one of the first layer 110, the second layer 120, and the third layer 130. For example, the first intermediate layer 151 may include an alloy material of a metal material included in the first layer 110 and a metal material included in the second layer 120. And the second intermediate layer 152 may include an alloy material of a metal material included in the second layer 120 and a metal material included in the third layer 130.

Alternatively, the first layer 110, the second layer 120, and the third layer 130 may include any one of a metal and a non-metal. For example, the first layer 110 and the third layer 130 may include the aforementioned metal material, and the second layer 120 may include the aforementioned non-metal material.

The first intermediate layer 151 and the second intermediate layer 152 are disposed between the first layer 110 and the second layer 120 and between the second layer 120 and the third layer 130 respectively. Alternatively, the first intermediate layer 151 and the second intermediate layer 152 may be omitted.

Figure 11:
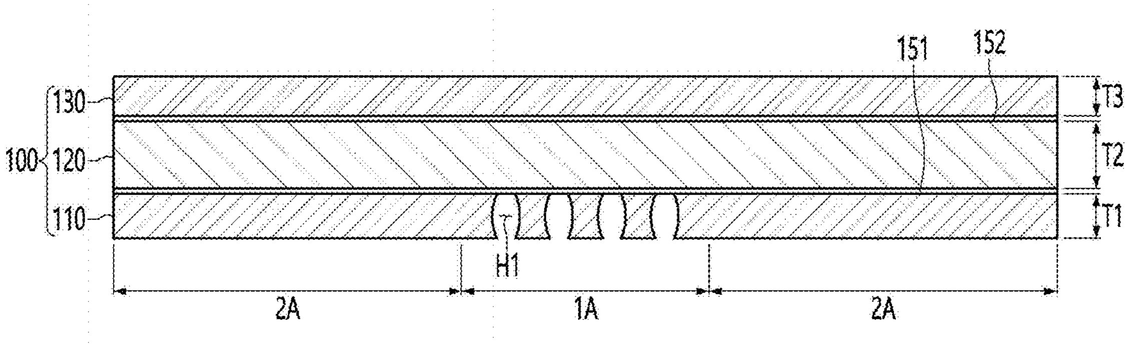
FIG. 11 is a cross-sectional view of the substrate for display according to the second embodiment.

In detail, referring to FIG. 11, when the first layer 110 and the second layer 120, and the second layer 120 and the third layer 130 are adhered using a separate adhesive material, the substrate 100 may include the first intermediate layer 151 defined as an adhesive layer between the first layer 110 and the second layer 120 and the second intermediate layer 152 defined as an adhesive layer between the second layer 120 and the third layer 130.

Figure 12:
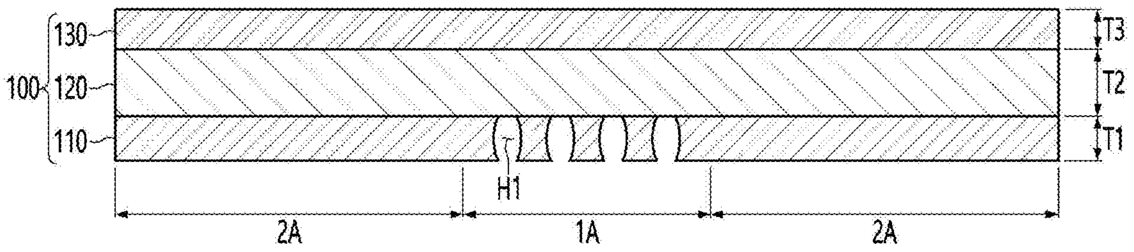
FIG. 12 is another cross-sectional view of the substrate for display according to the second embodiment.

Alternatively, referring to FIG. 12, when the first layer 110 and the second layer 120, and the second layer 120 and the third layer 130 are bonded by thermocompression without a separate adhesive material, in the substrate 100, the adhesive layer, that is, the first intermediate layer and the second intermediate layer may be omitted.

In this case, an inorganic filler or the like may be added to the second layer 120 to improve heat dissipation characteristics.

A pattern may be formed on any one of the first layer 110, the second layer 120, and the third layer 130. In detail, a hole-shaped pattern may be formed on any one of the first layer 110, the second layer 120, and the third layer 130.

For example, referring to FIGS. 11 and 12, the first layer 110 may include a plurality of first holes H1 formed through the first surface 111 and the second surface 112 opposite to the first surface 111.

In detail, the first layer 110 includes a first surface 111 facing the second layer 120 and a second surface 112 opposite to the first surface 111, and the first layer 110 may have a hole pattern formed from the second surface in the direction of the first surface.

That is, a hole pattern formed through the first layer 110 in a direction from the second surface to the first surface may be formed.

Accordingly, a groove-shaped pattern may be formed on the entire substrate for display according to the first embodiment by the first hole H1 formed in the first layer.

The first hole H1 formed in the first layer 110 may distribute stress caused by folding when the substrate for display is folded or restored. Accordingly, it is possible to prevent deformation of the substrate for display due to the stress generated when the substrate for display is folded or restored.

Meanwhile, hole patterns may not be formed in the second layer 120 and the third layer 130. That is, hole patterns may not be formed in the second layer 120, the third layer 130, and the first and second intermediate layers 151 and 152. The second layer 120 may be disposed on the first layer 110 to prevent bending of the substrate for display.

In detail, the first hole H1 formed in the first layer 110 may disperse the stress generated during the folding or restoration process of the substrate for display, but depending on the position or distribution of the hole pattern, a stress in the first layer 110 may become unbalanced. As a result, the first layer 110 may be bent, so that overall warpage may occur in the substrate for display.

At this time, the second layer 120 and the third layer 130 disposed on the first layer 110 control the warpage that may occur in the first layer 110. Accordingly, it is possible to prevent the substrate for display from being bent by the second layer 120 and the third layer 130.

The first layer 110, the second layer 120, and the third layer 130 may include different materials. For example, the first layer 110, the second layer 120, and the third layer 130 may include materials having different etching characteristics.

For example, when the substrate 100 is etched using a first etchant, the first layer 110 is etched by reacting with the first etchant, and the second layer 120 and the third layer 130 may not be etched because it does not react with the first etchant.

Alternatively, when the substrate 100 is etched using a second etchant, the second layer 120 is etched by reacting with the second etchant, and the first layer 110 and the third layer 130 may not be etched because it does not react with the second etchant.

Alternatively, when the substrate 100 is etched using a third etchant, the third layer 130 is etched by reacting with the third etchant, and the first layer 110 and the second layer 120 may not be etched because it does not react with the third etchant.

That is, the first layer 110, the second layer 120, or the third layer 130 may be an etching stopper layer.

For example, the first layer 110, the second layer 120, and the third layer 130 may include different metal materials. In detail, the first layer 110, the second layer 120, and the third layer 130 may include any one of metals such as Stainless Steel (SUS), copper, and aluminum, and in this case, the first layer 110, the second layer 120, and the third layer 130 may include different metal materials.

That is, since the first layer 110, the second layer 120, and the third layer 130 have different etching characteristics, in a specific etching solution, only one of the first layer 110, the second layer 120, and the third layer 130 may be etched.

That is, the first layer 110, the second layer 120, and the third layer 130 may be etched by different etching solutions.

Alternatively, any one of the first layer 110, the second layer 120, and the third layer 130 may have different etching characteristics from the other two layers. For example, the first layer and the third layer are etched by a first etchant, the second layer is not etched by the first etchant. And the second layer may be etched by the second etchant, and the first and third layers may not be etched by the second etchant.

In the second embodiment, a first hole H1 may be formed by etching the first layer 110. At this time, when the first hole H1 is formed in the first layer 110, the second layer 120 and the third layer 130 may serve as an etching stopper, and only the first layer 110 may be etched to form a first hole H1.

Accordingly, when the first hole H1 is formed in the first layer 110, the depth of the hole can be easily controlled. In other words, it is possible to easily control the depth of the first hole H1 of the substrate for display by the first hole H1 formed in the first layer 110.

That is, since the depth of the first hole H1 formed in the substrate for display is equal to the depth of the first hole H1 formed in the first layer, that is, the thickness of the first layer, by controlling the thickness of the first layer according to the desired depth of the first hole H1, the depth of the groove of the substrate for display may be easily controlled.

In general, a depth of a hole in a metal substrate formed by an etching process may be proportional to a diameter of the hole. That is, the depth of the hole formed in the metal substrate may increase as the size of the diameter of the hole increases.

Accordingly, there was a problem in that it was difficult to control the depth of the hole and the diameter of the hole, respectively. However, in the substrate for display according to the embodiment, since the first layer, the second layer, and the third layer have different etching characteristics, a hole of a desired depth can be formed regardless of the size of the diameter of the hole. Accordingly, the diameter and depth of the pattern formed on the substrate for display can be easily controlled.

Alternatively, the first layer 110 and the third layer 130 include the same metal material, and the second layer 120 may include a metal material different from that of the first layer 110 and the third layer 130.

Even at this time, when the first layer 110 is etched on the substrate 100, the second layer 120 disposed between the first layer 110 and the third layer 130 is an etching stopper. only the first layer 110 may be etched, and the second layer 120 and the third layer 130 may not be etched.

When the first layer and the third layer disposed on the outer surface of the substrate include the same metal material, when the substrate for display is folded, a layer having the same strength is disposed on the inner surface and the outer surface of the substrate. Therefore, it is possible to minimize the difference in stress generated on the inner surface and the outer surface of the substrate. That is, since the same material having similar properties is included on the inner and outer surfaces of the substrate compared to including different materials on the inner and outer surfaces of the substrate, the resulting stress difference may be reduced and folding characteristics are improve.

The total thickness of the substrate 100 including the first layer 110, the second layer 120, and the third layer 130 may be about 1 mm. In detail, the thickness of the substrate 100 may be 0.5 mm to 1.5 mm. When the thickness of the substrate 100 is less than 0.5 mm, the strength of the substrate 100 may be reduced, and when the thickness of the substrate 100 exceeds 1.5 mm, the folding characteristic of the substrate 100 may be reduced.

The first layer 110, the second layer 120, and the third layer 130 may be formed to have the same or different thicknesses.

For example, the thickness T1 of the first layer 110 in which the hole may be formed is greater than the thickness T2 of the second layer 120 and the thickness T3 of the third layer 130. In detail, in order to decrease the radius of curvature of the substrate for display, the depth of the first hole H1 must be increased. Accordingly, the thickness of the first layer 110 is formed to be greater than the thickness of the second layer 120 and the third layer 130 to increase the depth of the first hole H1.

Alternatively, the sum (T2+T3) of the thickness of the second layer 120 and the third layer 130 may be greater than the thickness T1 of the first layer 110. In detail, when the first hole H1 is formed in only one region of the first layer 110, in order to prevent warping of the substrate for display that may occur due to a stress difference with other regions, the sum (T2+T3) of the thickness of the second layer 120 and the third layer 130 may be formed to be greater than the thickness of the first layer 110.

Accordingly, when the substrate for display is about to be bent by having a different stress level for each region of the first layer 110, the second layer 120 and the third layer 130 on the first layer 110 can hold it, so that warping of the substrate for display can be prevented.

Alternatively, the first layer 110, the second layer 120, and the third layer 130 may have the same thickness in order to prevent the substrate for display from being bent and having a desired radius of curvature.

In addition, the first layer 110, the second layer 120, and the third layer 130 may have the same and similar elastic strength. For example, the first layer 110, the second layer 120, and the third layer 130 may have an elastic strength of about 300 Pa to 2.5 GPa.

The first layer 110, the second layer 120, and the third layer 130 may have the same or different elastic strengths depending on the use of the substrate for display.

That is, as described above, when the thickness of the first layer 110 is increased in order to increase the depth of the first hole formed in the first layer 110, the elastic strength of the first layer 110 may be greater than that of the second layer 120 and the third layer 130. Accordingly, it is possible to offset a decrease in the folding characteristic due to the increased thickness of the first layer 110.

Alternatively, when the thickness of the second layer 120 and the third layer 130 is increased to control the warpage of the substrate for display, the elastic strength of the second layer 120 and the third layer 130 may be greater than that of the first layer 110. Accordingly, it is possible to offset a decrease in the folding characteristic due to the increased thickness of the second layer 120 and the third layer 130.

Figure 13:
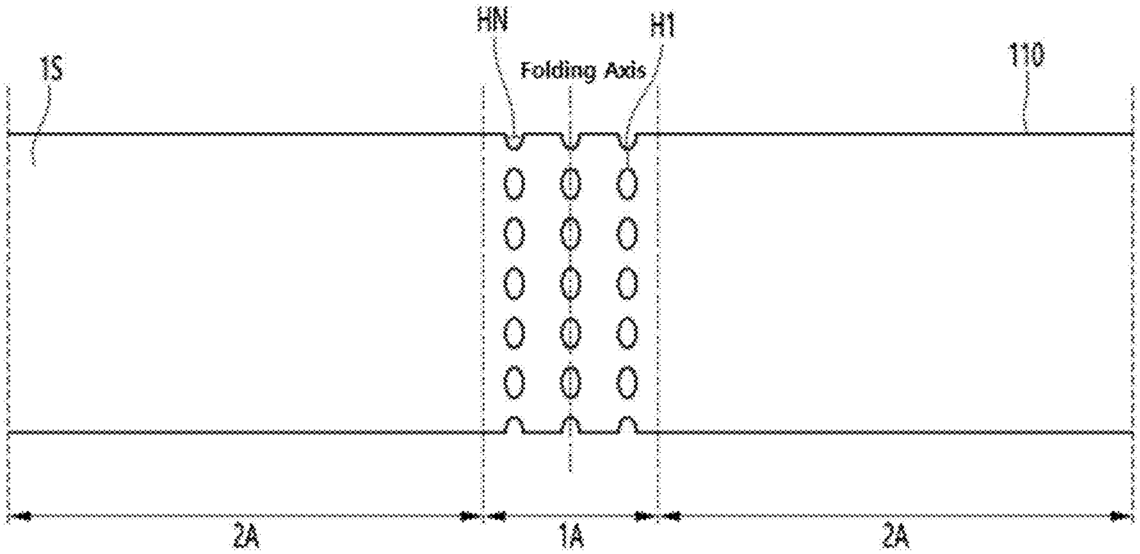
FIG. 13 is a top view of one surface of the substrate for display according to the second embodiment.
Figure 14:
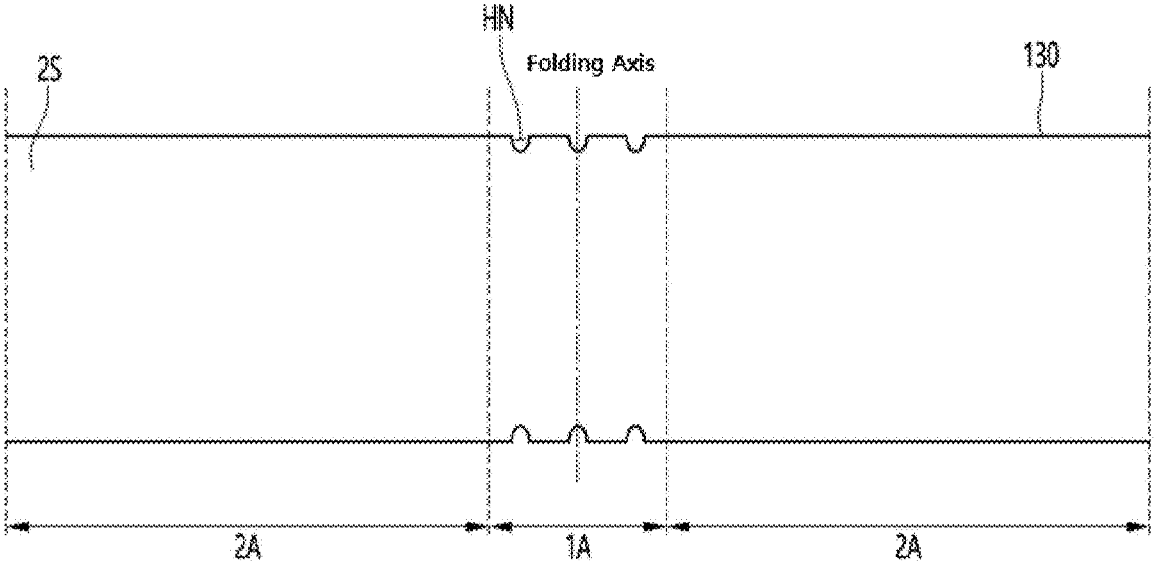
FIG. 14 is a top view of the other surface of the substrate for display according to the second embodiment.

FIGS. 13 and 14 are a top view of one surface and other surface of the substrate for display according to the second embodiment.

Referring to FIGS. 13 and 14, a plurality of grooves formed by partially etching the substrate 100 may be formed in the substrate for display. In detail, a first hole H1 formed through the first layer 110 is formed in the first layer 110 of the substrate 100. Accordingly, the substrate for display has a plurality of grooves as a whole.

In addition, a separate hole pattern may not be formed in the second layer 120 and the third layer 130 of the substrate 100. In detail, one surface of the second layer 120 and the third layer 130 may be formed to be flat.

That is, the second layer 120 may be disposed while covering both the region in which the first hole H1 is formed and the region in which the first hole H1 is not formed in the first layer 110, and the third layer 130 may be disposed while covering the area of the second layer.

In this case, the sum of the thicknesses of the second layer 120 and the third layer 130 may be greater than the thickness of the first layer 110. That is, since the first hole H1 is formed only in the first region that is the folding region in the first layer 110, a stress difference may occur between the first region and the second region that is the unfolding region. Due to this stress difference, warpage may occur in the first layer 110, and as a whole, warpage may occur in the substrate for display.

Accordingly, the sum of the thicknesses of the second layer 120 and the third layer 130 is formed to be larger than the thickness of the first layer 110, and then it is possible to prevent bending due to a difference in stress in the first layer 110. That is, it is possible to control bending of the substrate for display by the second layer 120 and the third layer 130.

Meanwhile, the description of the hole and the hinge part of the substrate for display according to the second embodiment is the same as the description of the hole and the hinge part of the substrate for display according to the first embodiment described above, and thus the following description will be omitted.

Figure 15:
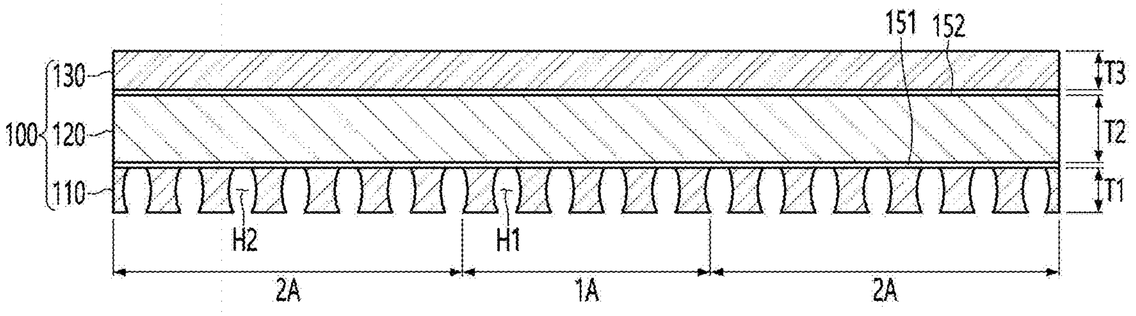
FIG. 15 is another cross-sectional view of the substrate for display according to the second embodiment.
Figure 16:
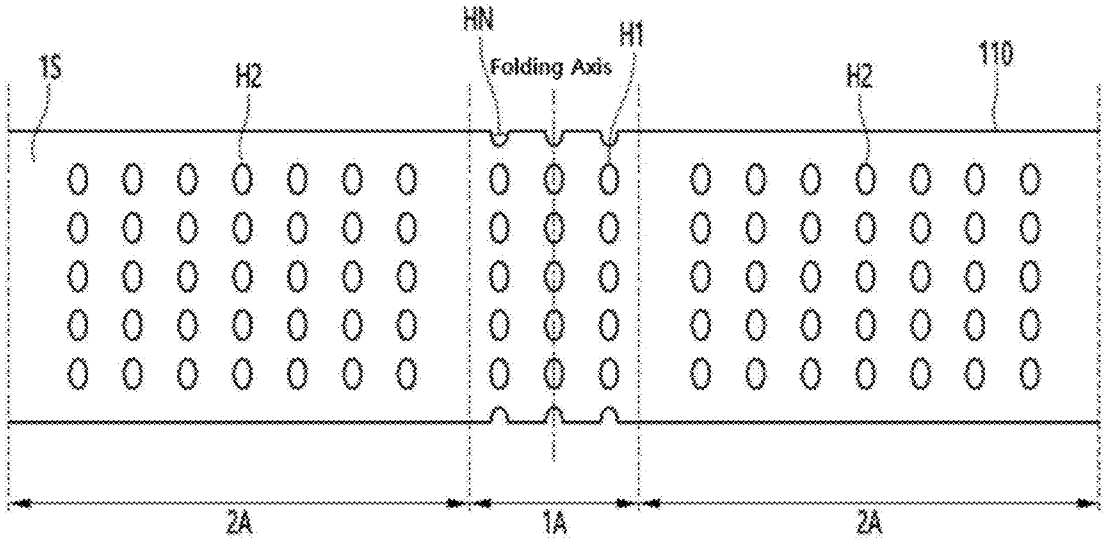
FIG. 16 is another top view of one surface of the substrate for display according to the second embodiment.

Meanwhile, referring to FIGS. 15 and 16, in the substrate for display according to the second embodiment, holes may be formed in the entire area of the substrate.

Referring to 15 and 16, holes may be formed in both the first region 1A and the second region 2A in the first layer 110. In detail, a second hole H2 may also be formed in the second area 2A defined as an unfolding area. That is, holes may be formed in the entire area of the substrate for display.

In this case, the thickness of the first layer 110 may be greater than the sum of the thicknesses of the second layer 120 and the third layer 130.

Accordingly, the thickness of the first layer 110 may be greater than the sum of the thicknesses of the second layer 120 and the third layer 130. That is, since holes are formed in the entire region of the first layer 110, the thickness of the second layer 120 and the third layer 130 to prevent warping of the first layer may be reduced, the depth of the hole formed in the first layer may be increased. Accordingly, by reducing the radius of curvature of the substrate for display, it is possible to improve the folding characteristics of the substrate for display.

Figure 17:
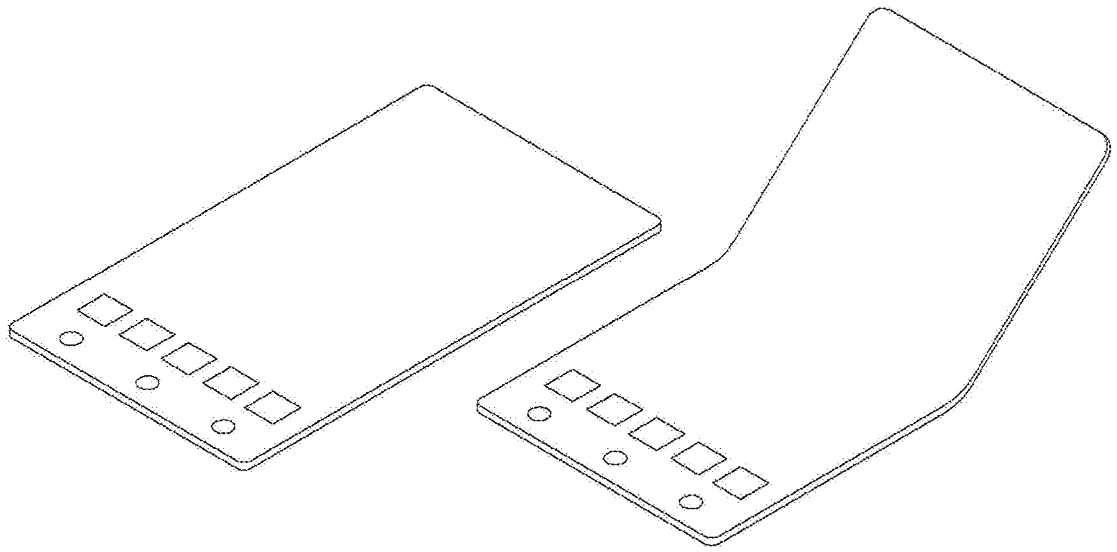
FIG. 17 is a view for describing an example in which the substrate for display according to an embodiment is applied.

FIG. 17 is a view for describing an example in which a substrate for display according to embodiments is applied.

Referring to FIG. 17, the substrate for display according to the embodiments may be applied to a flexible display device that displays a display.

For example, the substrate for display according to the embodiments may be applied to a flexible display device such as a mobile phone or a tablet.

Such a substrate for display may be applied to flexible display devices such as a mobile phone, a tablet, and the like that are flexible, bent or folded.

The substrate for display is applied to the flexible display devices such as the mobile phone, the tablet, and the like that are flexible, bent or folded and may improve the reliability of the flexible display device by improving the folding reliability in the display device that is repeatedly folded or restored.

The characteristics, structures, effects, and the like described in the above-described embodiments are included in at least one embodiment of the present invention, but are not limited to only one embodiment. Furthermore, the characteristic, structure, and effect illustrated in each embodiment may be combined or modified for other embodiments by a person skilled in the art. Accordingly, it is to be understood that such combination and modification are included in the scope of the present invention.

In addition, embodiments are mostly described above, but the embodiments are merely examples and do not limit the present invention, and a person skilled in the art may appreciate that several variations and applications not presented above may be made without departing from the essential characteristic of embodiments. For example, each component specifically represented in the embodiments may be varied. In addition, it should be construed that differences related to such a variation and such an application are included in the scope of the present invention defined in the following claims.

Technical Problem

An embodiment is to provide a substrate for a display that has a thin thickness and can implement a small radius of curvature.

Technical Solution

A substrate for display according to an embodiment includes one surface and the other surface opposite to the one surface, and includes a first region and a second region, wherein the display substrate is folded to face the one surface, and the first area is defined as a folding area, the second area is defined as an unfolding area, and the substrate for display includes a first layer and a second layer disposed on the first layer, the first region of the first layer includes a plurality of first holes or first grooves, wherein the first layer is an etch layer and the second layer is an etch stopper layer.

Advantageous Effects

The substrate for display according to the embodiment may be formed of a plurality of layers having different etching characteristics.

Accordingly, since the first layer and the second layer are etched by different etching solutions, any one of the first layer and the second layer may be an etching stopper layer when a hole is formed in the substrate for display.

Accordingly, when forming a pattern such as a hole for relieving stress on the substrate for display, the depth of the hole can be easily controlled regardless of the diameter of the hole. Accordingly, it is possible to easily control the diameter, depth, and number of holes according to the strength and radius of curvature, ie, folding characteristics, of the substrate for display to be implemented.

In addition, since the hole pattern is formed on only one of the first layer and the second layer in the substrate for display according to the embodiment, when bonding a display panel, a touch panel disposed on the substrate for display, the substrate for display, a separate layer for preventing the hole pattern from being recognized between the substrate for display and the panel may be omitted.

Accordingly, process efficiency may be improved by omitting an additional process, and a thickness of the foldable display device may be reduced, thereby improving folding characteristics and reliability.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A substrate for display, comprising:

one surface and the other surface opposite to the one surface; and a first area and a second area, wherein the substrate for display includes a first layer, a second layer disposed on the first layer and an adhesive layer between the first layer and the second layer, wherein the first area of the first layer comprises a plurality of holes, wherein the first layer comprises a metal, wherein the second layer comprises a polymer, wherein the hole has a diameter of 10 μm to 500 μm and a depth of 100 μm to 10000 μm, wherein the first layer and the second layer have an elastic modulus of 300 MPa to 2.5 GPa, wherein a thickness of the second layer is greater than a thickness of the first layer, and wherein an elastic modulus of the second layer is greater than an elastic modulus of the first layer.

2. The substrate for display of claim 1, wherein the first area includes a plurality of hinge parts, wherein each of the plurality of hinge parts is defined as a hole penetrating that penetrates from the one surface to the other surface at one of opposite end regions of the substrate in a width direction.

3. The substrate for display of claim 2, wherein the hinge part and the hole overlap in the width direction of the substrate.

4. The substrate for display of claim 2, wherein the holes are disposed irregularly.

5. The substrate for display of claim 1, wherein an inorganic filler is disposed inside the second layer.

6. The substrate for display of claim 1, wherein the second layer does not include a hole or a groove.

7. The substrate for display of claim 1, wherein a resin material is filled in the hole or the groove.

8. The substrate for display of claim 1, further comprising:

an intermediate layer disposed between the first layer and the second layer, wherein the intermediate layer is an adhesive.

9. The substrate for display of claim 8, wherein the intermediate layer comprises a pressure sensitive adhesive.

10. The substrate for display of claim 9, wherein the intermediate layer includes an alloy material of a metal included in the first layer and a metal material included in the second layer.

11. The substrate for display of claim 1, wherein the first layer reacts with a first etchant, and the second layer does not react with the first etchant.

12. The substrate for display of claim 11, wherein the second layer includes a non-metallic material.

13. A display device, comprising;

at least one of a display panel or a touch panel disposed on the substrate for display of claim 1; and a cover window disposed on the panel.

* * * * *